(12) United States Patent
Lee et al.

(10) Patent No.: US 6,831,860 B2
(45) Date of Patent: Dec. 14, 2004

(54) NONVOLATILE SEMICONDUCTOR MEMORY DEVICE

(75) Inventors: Byeong-Hoon Lee, Seoul (KR); Seung-Keun Lee, Kyonggi-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 09/997,080

(22) Filed: Nov. 28, 2001

(65) Prior Publication Data
US 2002/0176283 A1 Nov. 28, 2002

(30) Foreign Application Priority Data
May 23, 2001 (KR) .......................... 2001-28257

(51) Int. Cl.[7] .................... G11C 16/04; G11C 16/06
(52) U.S. Cl. .................... 365/185.11; 365/185.17; 365/185.27; 365/185.29; 365/185.33
(58) Field of Search .................... 365/185.11, 185.17, 365/185.27, 185.29, 185.33

(56) References Cited

U.S. PATENT DOCUMENTS

| 5,793,678 A | * | 8/1998 | Kato et al. ............. 365/185.27 |
| 5,994,732 A | * | 11/1999 | Ajika et al. ................. 257/315 |
| 6,091,632 A | * | 7/2000 | Yoshimi et al. ......... 365/185.11 |
| 6,388,921 B1 | * | 5/2002 | Yamamoto et al. .... 365/185.11 |

* cited by examiner

Primary Examiner—Trong Phan
(74) Attorney, Agent, or Firm—Marger Johnson & McCollom, P.C.

(57) ABSTRACT

A sector structure of a flash memory device minimizes a layout area in a chip without deteriorating a high-speed operation. The sector structure of the flash memory device includes a plurality of sectors, each sector including memory cell transistors in a cell array block sharing a common bulk region with transistors in a column decoder block.

22 Claims, 6 Drawing Sheets

FIG.8 (PRIOR ART)

| Operation Mode | Vg | Vd | Vs | Vb |
|---|---|---|---|---|
| Program | +10V | +5V ~ +6V | 0V | 0V |
| Erase | -10V | Floating | Floating | +5V |
| Read | +4.5V | +1V | 0V | 0V |

NONVOLATILE SEMICONDUCTOR MEMORY DEVICE

This application claims priority from Korean Patent Application No. 2001-28257, filed May 23, 2001, the contents of which are herein incorporated by reference in their entirety.

BACKGROUND OF THE INVENTION

1. Field of the Invention

The present invention relates to an electrically erasable and programmable nonvolatile semiconductor memory device, and more particularly to an improved sector structure of a nonvolatile semiconductor memory device.

2. Description of Related Art

Semiconductor memory devices are generally classified as either volatile or nonvolatile devices. Volatile semiconductor memory devices are further classified as either dynamic random access memory (DRAM) devices or static random access memory (SRAM) devices. Volatile memory devices perform quick read and write operations, but unfortunately lose the contents stored in their memory cells when an external power supply is cut off.

Nonvolatile semiconductor memory devices are further classified as mask read only memory (MROM) devices, programmable read only memory (PROM) devices, or electrically erasable and programmable read only memory (EEPROM) devices. A nonvolatile memory device is able to permanently store the contents of its memory cells even when an external power supply is cut off. Nonvolatile memory devices are therefore preferred for storing information that must be retained despite power loss.

In MROM and PROM devices, however, it is inconvenient to erase or re-program the contents programmed therein at the on-board state. Common users are therefore unable to perform the erase and write (or program) processes. In EEPROM devices, on the other hand, the electrical erase and write processes are conveniently available. For these reasons, EEPROM devices have continuously grown in popularity for use in applications requiring a system program storage device or an auxiliary memory device where the continuous renewal of its contents is desirable.

NOR-type flash EEPROMs, in particular, which provide a flash erase function, have been welcomed by users who demand a high speed memory device offering faster programming, write, and read operations than NAND-type or AND-type EEPROMs. The general operation of a conventional NOR-type flash memory device will be described below to provide a more thorough understanding of the present invention.

FIG. 7 is a cross-sectional view of a memory cell transistor forming a memory cell unit of a conventional NOR-type flash memory device. Referring to FIG. 7, an n-type source region 3 is formed on a p-type substrate 2, and an n-type drain region 4 is formed with a p-type channel region apart from the source region 3. A floating gate electrode 6, insulated by a thin insulating layer 7 having a thickness less than 100 angstroms, is formed on the p-type channel region. A control gate 8 (which may be called a word line) is formed over another insulating layer 7 above the floating gate electrode 6.

Referring to FIG. 8, the operation of the memory cell transistor of FIG. 7 will now be described. FIG. 8 is a table indicating voltage levels to be applied to the transistor depending on the operational mode of the semiconductor device. The semiconductor device operational modes include a program mode, an erase mode, and a read mode. Although not shown in FIG. 8, an erase repair mode is also provided.

The program operation is performed by injecting hot electrons from the drain region 4 and its adjacent channel region 5 into the floating gate electrode 6. As shown in FIG. 8, the hot electrons for the program operation are generated by applying a high level of voltage (e.g., 10V) to the control gate electrode 8 and by applying an adequate level of voltage (e.g., 5–6V) to the drain region 4. The source region 3 and the p-type substrate region 2 are grounded. Hot electrons are thereby injected into the floating gate electrode 6. After negative charges have been sufficiently accumulated at the floating gate electrode 6, the memory cell transistor has a higher level of threshold voltage than it had prior to the program operation. More specifically, a programmed memory cell transistor generally has voltage distribution in the range of 6 to 7V. A programmed memory cell transistor is called "an off-cell."

The read operation is performed by applying a positive voltage level (e.g., 1V) to the drain region 4 and a predetermined voltage level (e.g., 4.5V) to the control gate electrode 8. The source region 3 and the substrate region 2 are grounded. As noted above, after the program operation, a programmed memory cell transistor has a higher threshold voltage and therefore functions as an off-cell during the read operation. A programmed cell operates as an off-cell because it prevents current flow from the drain region 4 to the source region 3 during the read operation.

In the NOR-type flash memory cell transistor, the erase operation is performed by generating a Fowler-Nordheim tunneling phenomenon (F-N tunneling) between a bulk region formed in the substrate 2 and the control gate electrode 8. F-N tunneling requires a high level of negative voltage (e.g., −10V) to be applied to the control gate electrode 8 and an adequate level of positive voltage (e.g., 5V) to be applied to the bulk region 2. The drain region 4 is set at high impedance to ensure an effective erase operation.

These erase operation conditions create a strong magnetic field between the control gate electrode 8 and the bulk region, causing F-N tunneling. The negative charges at the floating gate electrode 6 are thereby discharged to the source region 3. The F-N tunneling occurs when a magnetic field of between 6 to 7 MV/cm is applied to the conductive layer 6 between the insulating layers 7. In the aforementioned memory cell transistor, each gate insulating layer 7 is formed having a thickness of about 100 angstroms to facilitate the F-N tunneling. As a result of the erase operation, the level of threshold voltage at the memory cell transistor ranges between approximately 1V to 3V. The threshold voltage is therefore lower than following the program operation, when electric charges are accumulated at the floating gate electrode 6, and an erased memory cell transistor is called an "on-cell".

In the conventional flash memory device, a plurality of cells are connected to a common bulk region to provide a high memory integration density. In this manner, all of the memory cells in the common bulk region can be simultaneously erased during the erase operation. Erase units, or sectors, are formed as divided regions of the flash memory. An erase region can, for instance, comprise a 64 Kbyte sector.

During the read operation, a memory cell having a threshold voltage level lowered during the erase operation functions as an on-cell because a current path is formed from a drain region to a source region. Unfortunately, an erase operation performed to lower the threshold voltage of the memory cell transistors may result in threshold voltages lower than 0V, beyond the erased voltage cell range of 1V to 3V. This over-erasing results from non-uniformity between threshold voltages of the various memory cell transistors. Memory cell transistors having threshold voltages less than 0V are called "over-erased cells." Over-erased memory cells require a curing operation (or erase-repair operation) to increase the threshold voltages to within the erased voltage range of between about 1V to 3V.

The erase-repair operation can be performed by grounding the source region 3 of the over-erased memory cell transistors and the p-type substrate 2, and applying a positive voltage level (e.g., 2V to 5V) to the control gate electrode 8. Another positive voltage level (e.g., 6V to 9V) is applied to the drain region 4. As a result of the erase-repair operation, an amount of negative charge, less than that of the program operation, is accumulated at the floating gate electrode 6 to cause it to remain at the threshold voltage range of about 1V to 3V.

In order to apply appropriate voltages to the memory cell transistors to perform the programming, reading, and erasing operations, each sector of the conventional NOR-type semiconductor device has a structure similar to that shown in FIG. 1. Referring now to FIG. 1, each sector has a cell array block 101 including a plurality of memory cell transistors M1-Mnm that form a memory cell array. The cell array block 101 includes a plurality of word lines WL0 to WLn-1. Each of the word lines WLi is commonly connected to n number of cell gates. In addition, a plurality of bit lines BL0 to BLm-1 are formed therein, wherein each of the bit lines BLi is commonly connected to m cell drains.

A column decoder block 102 is connected to the cell array block 101 to perform a decoding operation. The m number of bit lines are connected to each of the common data lines DLi through a corresponding column decoder. The common data lines include I number of lines DL0 to DLl-1. The common data lines are respectively connected to corresponding write drivers 200, 201 and sense amplifiers 300, 310. All of the source terminals of the memory cell transistors in the cell array block 101 are connected to a common source line SL, driven by the source line driver 500. All of the memory cell transistors are further connected to a common bulk line Bulk at its bulk terminals. The common bulk line Bulk is driven by the bulk driver 400. The transistors T1, T2, T3 in the column decoder block 102 are formed in a separate bulk, which is grounded to 0V.

Referring to FIG. 2, the bulk region 10 of the cell array block 101 and the bulk region 11 of the column decoder block 102 are separately and independently formed in a common substrate 1, so that a high voltage does not affect the data lines during an erasing operation. For example, when a high voltage (e.g., 5V) is applied to the bulk terminal (Bulk) of the cell array block 101 while an erasing operation is performed using a channel erase scheme, the high voltage is prevented from being applied to the data line DL. More specifically, the pass signal YPASSi (e.g., 0V) is applied to the gates of the transistors in the column decoder block 102 so that the data line DL will not be influenced by the high voltage.

Unfortunately, however, because the P-well bulk region 10 of the cell array block 101 must be spaced a predetermined distance apart from the P-well bulk region 11 of the column decoder block 102, the separately formed bulks of the conventional device result in an increase in the layout area of a chip and hence chip size. This increase in size limits the degree of integration available in the semiconductor device. In addition, the greater the number of cell array blocks 101 and column decoder blocks 102, the larger the required chip size and the greater the impediment to a high degree of integration.

Because the bulks of the transistor devices in the cell array block and column decoder block of the conventional NOR-type flash memories are separately and independently formed, a lower integration density is available. The industry is in need of an EEPROM for use in a variety of computer or microprocessor controlled electronic devices that can be electrically erasable or programmable at a high speed and which occupies a minimal layout area. It is also desirable to replace conventional hard disk devices with EEPROM memory devices having minimal layout areas. Conventional hard disk devices used as auxiliary memory devices in battery powered computer systems include a rotary magnetic disk and occupy a relatively large area. Designers of portable computers and notebook computers have therefore been interested in the development of an EEPROM having a compact size and high speed operation that can replace these hard disk devices.

SUMMARY OF THE INVENTION

An object of the present invention is to provide a method of sharing bulk regions to minimize or reduce a layout area in a NOR-type nonvolatile semiconductor device.

Another object of the present invention is to provide a method of forming a bulk region of a column decoder in a NOR-type nonvolatile semiconductor device.

Still another object of the present invention is to provide a bulk region structure of a cell array block and a column decoder block in a nonvolatile semiconductor memory device.

Yet another object of the present invention is to reduce chip area by providing a nonvolatile semiconductor memory device with a sector structure having a common bulk region.

In accordance with one aspect of the present invention, a sector structure of a nonvolatile semiconductor memory device includes memory cell transistors in a cell array block and transistors in a column decoder block. The cell array block and column decoder block share a common bulk region.

In accordance with another aspect of the present invention, a method of forming a bulk region of a column decoder in a NOR-type nonvolatile semiconductor device includes providing a common bulk region for transistors in a column decoder block and memory cell transistors in a cell array block.

BRIEF DESCRIPTION OF THE DRAWINGS

The foregoing and other objects and advantages of the present invention will become more readily apparent through the following detailed description of preferred embodiments, made with reference to the attached drawings, in which:

FIG. 8 is a table showing applied voltages for various operational modes in the NOR-type memory cell transistor of FIG. 7.

DETAILED DESCRIPTION OF PREFERRED EMBODIMENTS

Figure 1:
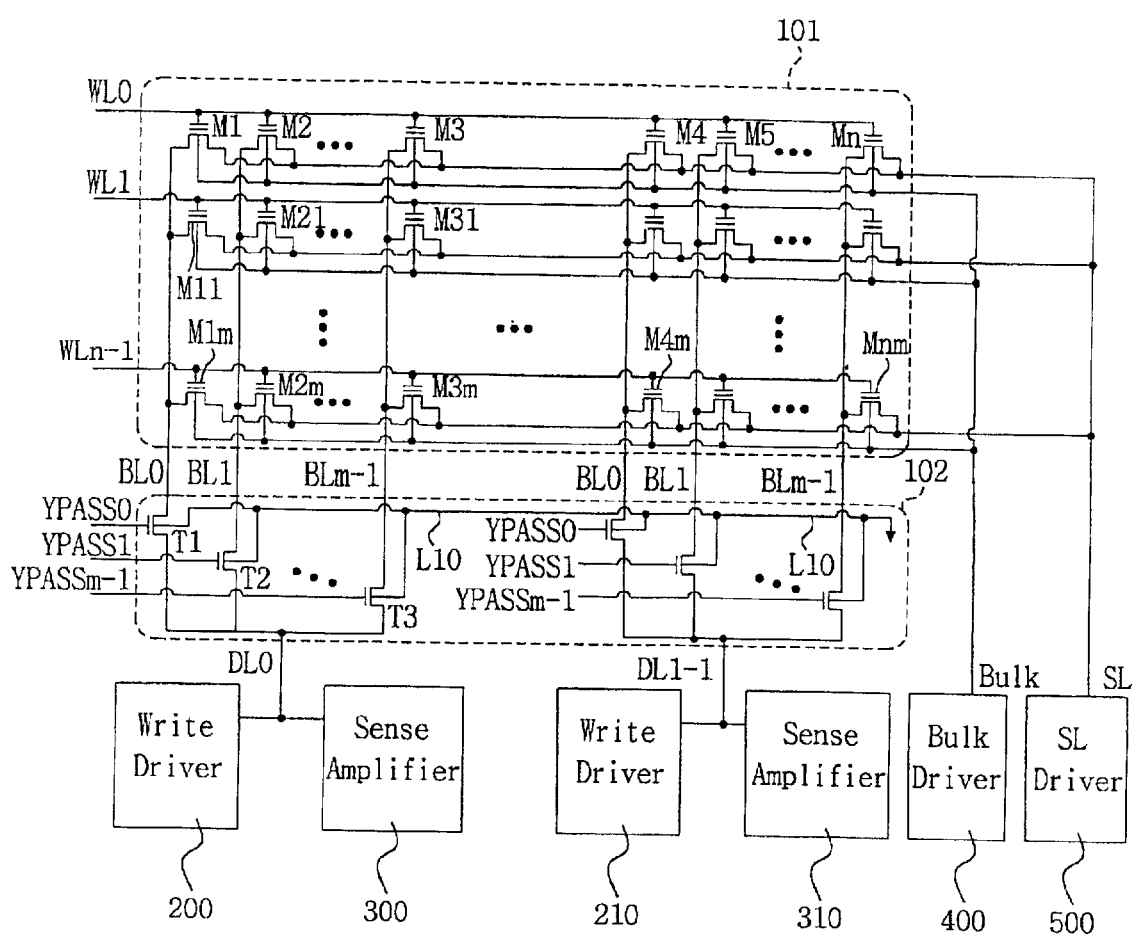
FIG. 1 is a schematic circuit and block diagram illustrating a sector structure of a conventional NOR-type flash memory device.

Various embodiments of the present invention will now be described in detail with reference to the foregoing drawings. Throughout the description, like reference numerals will be used to designate of like or equivalent parts for simplicity of illustration and explanation. It should also be noted that although preferred embodiments will be explained below, various changes and modifications to those embodiments within the scope of this invention will be apparent to one skilled in the art. Also, the description of well-known functions and structures will generally be omitted, except where helpful in clarifying key points of the present invention.

Figure 3:
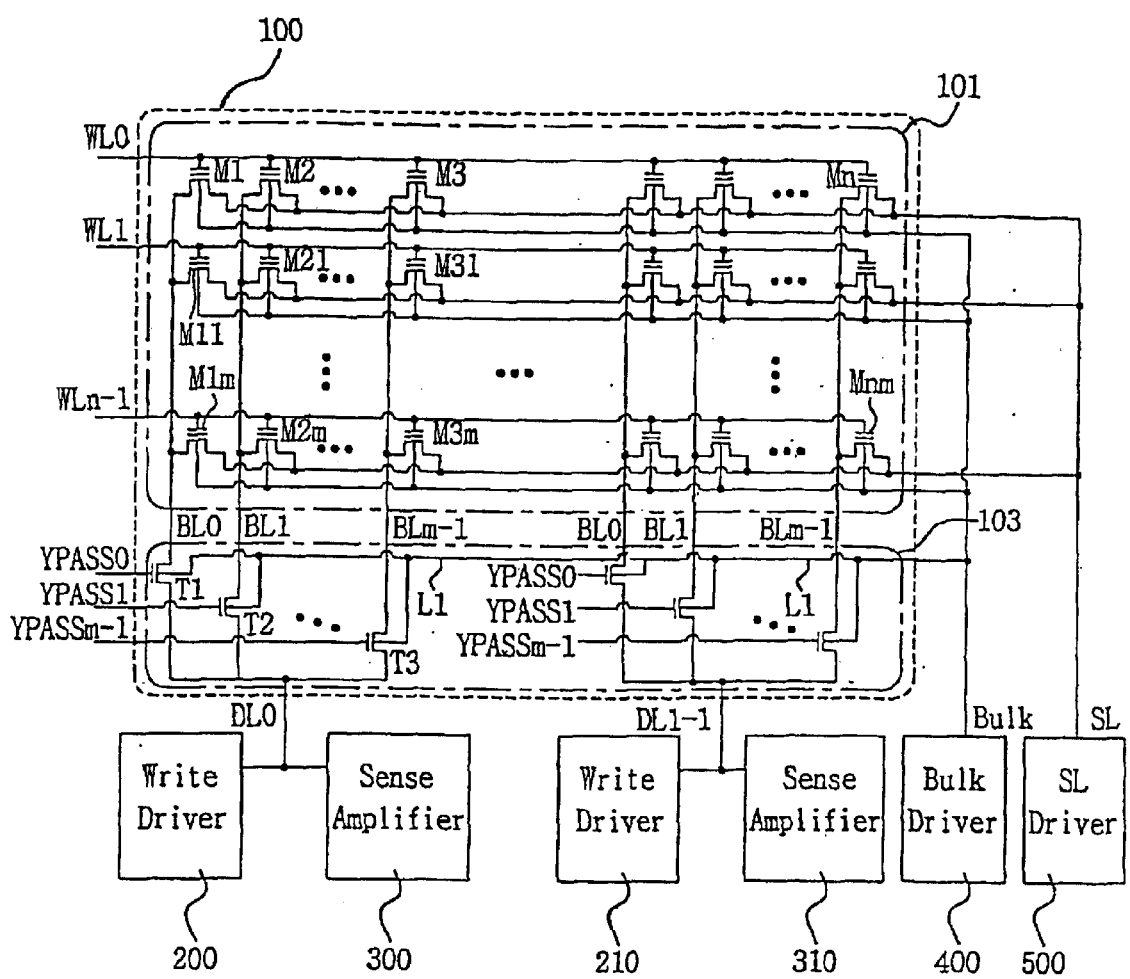
FIG. 3 is a schematic circuit and block diagram illustrating a sector structure of a NOR-type flash memory device according to an embodiment of the present invention.
Figure 4:
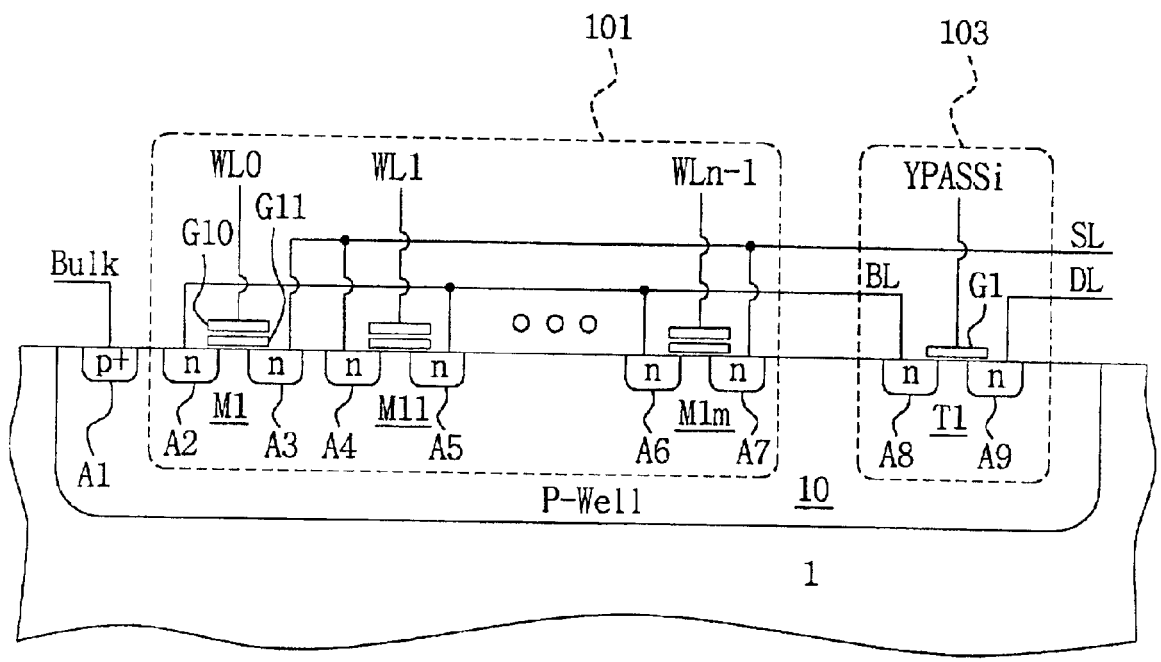
FIG. 4 is a cross-sectional view of the sector structure of FIG. 3.

FIG. 3 is a schematic circuit and block diagram illustrating a sector structure 100 of a NOR-type flash memory device according to one embodiment of the present invention. FIG. 4 is a cross-sectional view of the sector structure 100 of FIG. 3. The structure of the sector 100 is somewhat similar to that of the sector shown in FIG. 1. In particular, referring to FIG. 3, the sector 100 has a cell array block 101 that includes a plurality of memory cell transistors forming a memory cell array. A column decoder block 103 is connected to the cell array block 101 to perform a decoding operation. The cell array block 101 includes a plurality of word lines WL0 to WLn-1. Each of the word lines WLi is commonly connected to n cell gates.

In addition, a plurality of bit lines BL0 to BLm-1 are formed therein, where each of the bit lines BLi is commonly connected to m cell drains. The m bit lines are connected to each of the common data lines DLi through a corresponding column decoder. The common data lines include I lines DL0 to DLI-1. The common data lines are each respectively connected to a corresponding write driver 200, 201 and sense amplifier 300, 310. The source terminals of the memory cell transistors in the cell block 101 are connected to one source line SL to thereby be driven by the source line driver 500.

Unlike the structure shown in FIG. 1, however, the bulk terminals of the memory cell transistors in the cell array block 101 of FIG. 3 are connected to the bulk driver 400 together with the bulk terminals of the transistors T1, T2, T3 in the column decoder block 103. In other words, the memory cell transistors and the decoder transistors T1, T2, T3 share a common bulk region, thereby reducing the layout area in a chip.

Figure 2:
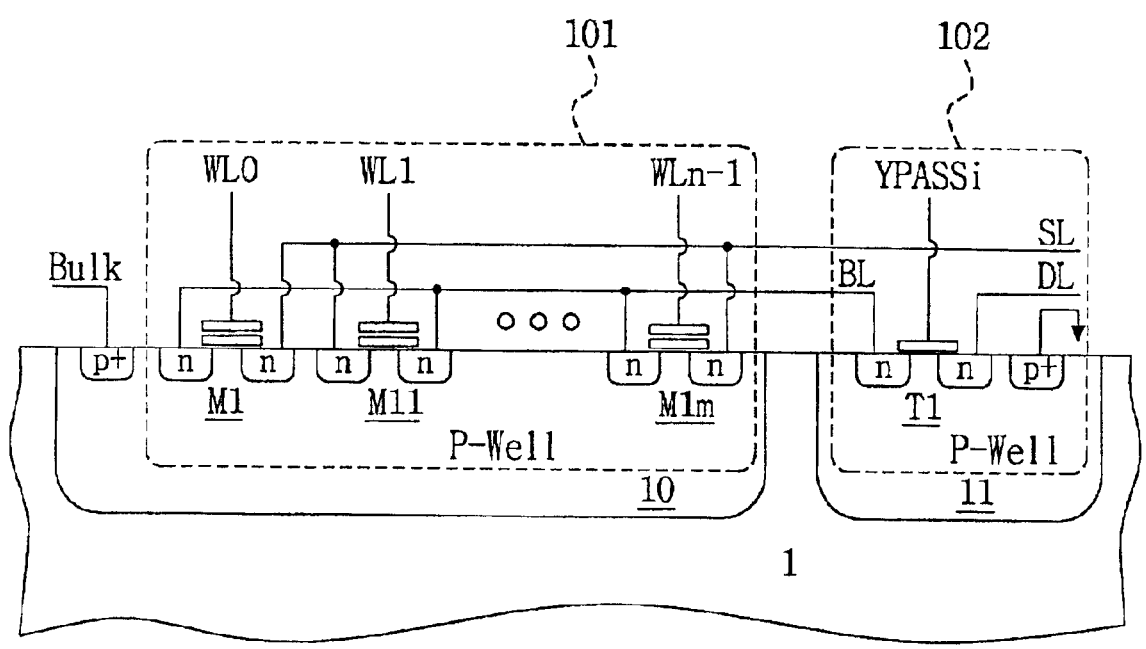
FIG. 2 is a cross sectional view of the sector structure of FIG. 1.

Referring to FIG. 4, the bulk region of this embodiment is a pocket-type P-well 10 formed on a substrate 1. It should be noted, however, that the bulk region may be another type of conductive well or the substrate itself. Each of the transistors in a sector are formed in a common bulk region 10. For example, the memory cell transistors M1, M11, M1m of the cell array block 101 and the transistor T1 of the column decoder block 103 are commonly formed in the same bulk region (P-well) 10 in the substrate 1. A high concentration P-type well A1 in the bulk region 10 is connected to the bulk line Bulk to receive a bulk voltage at an area of minimized contact resistance. Unlike the sector structure of FIG. 2, the P-well A1 in FIG. 4 is shared by the blocks 101, 103, rather than separated as shown in FIG. 2. This results in a reduced layout area in the chip.

Figure 5:
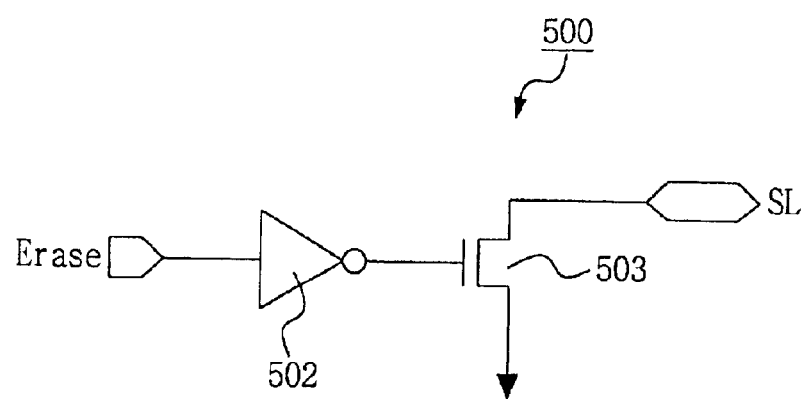
FIG. 5 is a schematic circuit diagram showing a source line driver of the NOR-type flash memory device of FIG. 3.

FIG. 5 is a schematic circuit diagram showing a source line driver 500 of the circuit 100 of FIG. 3. Referring to FIG. 5, the source line driver 500 includes an inverter 502 for receiving and inverting an erase signal input during a erase mode. An NMOS transistor 503 is also included for setting a voltage level of the source line SL to a ground voltage level in response to an output of the inverter 502. The erase signal is at a logic "low" level during the erase mode but maintains a logic "high" level during the other operational modes. Accordingly, the transistor 503 receives a "high" level at its gate terminal and is turned on during the erase mode. As a result, the voltage level of the source line SL is set as a ground voltage (e.g., 0V).

Figure 6:
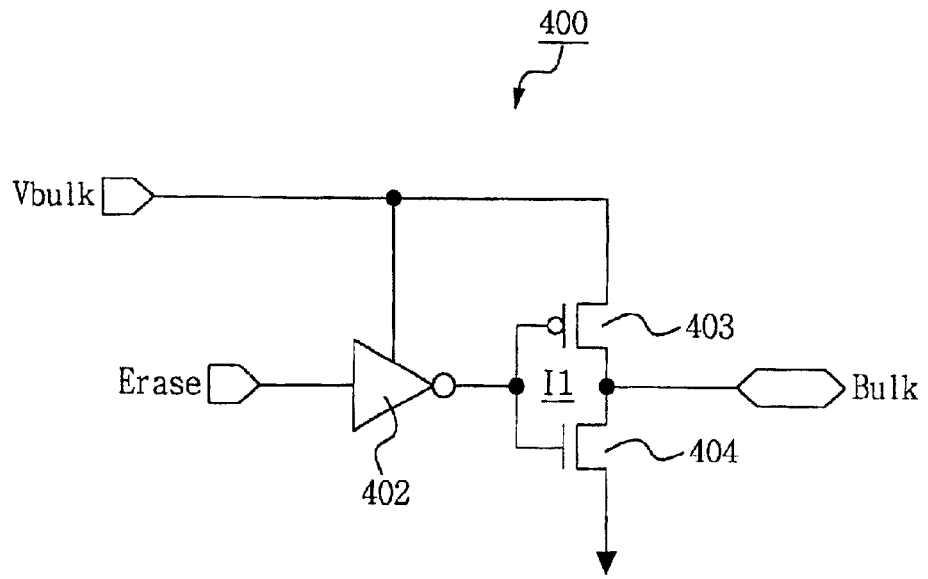
FIG. 6 is a schematic circuit diagram of the bulk driver of the NOR-type flash memory device of FIG. 3.

FIG. 6 is a schematic circuit diagram of the bulk driver 400 in the circuit 100 of FIG. 3. Referring to FIG. 6, the bulk driver 400 comprises an inverter 402 for inverting the erase signal and an inverter I1 for inverting an output of the inverter 402. The inverter I1 is a CMOS inverter including a PMOS transistor 403 and an NMOS transistor 404. The output terminal of the inverter I1 is connected to the bulk line Bulk to apply a bulk voltage to the P-well shown in FIG. 4. The inverters 402 and I1 both receive a common bulk voltage Vbulk as an operation voltage through source terminals thereof.

Figure 7:
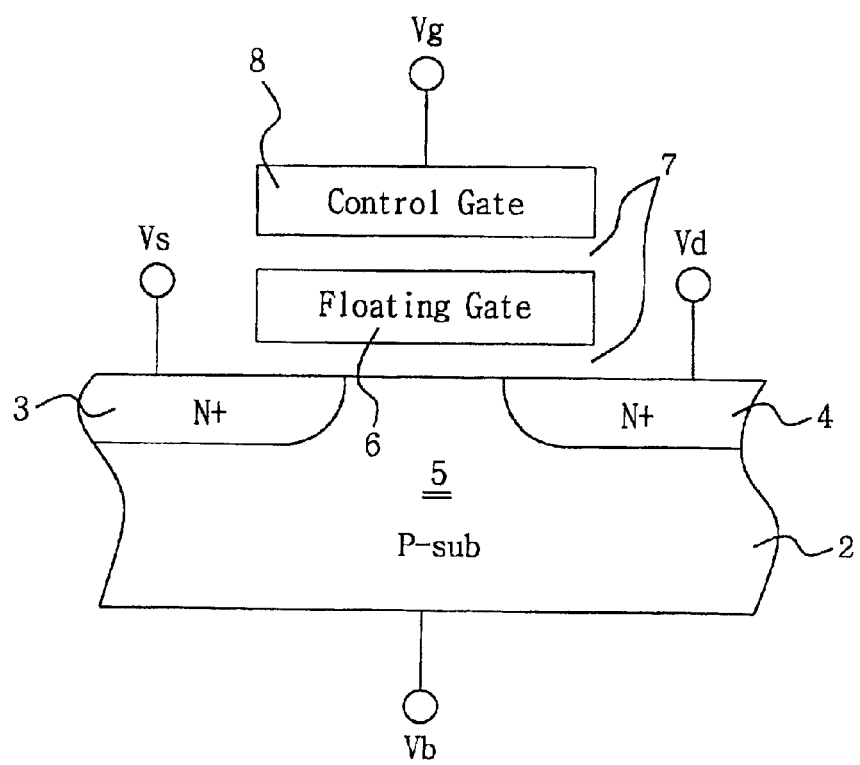
FIG. 7 is a cross-sectional view showing the structure of a conventional NOR-type memory cell transistor.

The erase operation according to an embodiment of the present invention will be explained below with reference to FIGS. 3 and 4. Similar to the prior art, in this embodiment, an erase operation is performed in terms of a sector unit. This means that all memory cell transistors in the same bulk region are electrically erased together. A sector can include memory cell transistors supplying 64 Kbytes of memory. As described above with reference to FIGS. 7 and 8, to cause F-N tunneling in a floating gate 6 between a control gate 8 and a bulk region in a substrate 2, the electrode of the control gate 8 is applied with −10V and the bulk region is applied with 5V. The drain region 4 is set at a high impedance. As a result, a strong electric field is created between the electrode of the control gate 8 and the bulk region, thereby generating the F-N tunneling. Accordingly, the negative charges that are accumulated in the electrode of the floating gate 6 are discharged into the source region 3. As a result of the erase operation, the threshold voltage of the memory cell transistors becomes lower than when charges are accumulated in the electrode of the floating gate 6.

Furthermore, referring back to FIGS. 3 and 4, as a result of the shared common bulk region 10 in the sector structure 100 of this embodiment of the present invention, when the bulk terminal of the cell array block 101 is supplied with 5V, the bulk voltage of 5V is also applied to the data line DL connected to the n-well A9 through a pn junction. Despite this, the write drivers 200, 210 and the sense amplifiers 300, 310 do not influence the circuit operation during an erase operation because they are at a state of high impedance.

An advantage of various aspects of the present invention is that the improved sector structure minimizes the layout area in a semiconductor device. Accordingly, the greater the number of sectors, the greater the reduction in layout area. Although the invention has been described in terms of preferred embodiments, those skilled in the art will recognize that the invention can be modified in arrangement and detail without departing from the spirit and scope of the appended claims. Among other things, the common bulk region configuration disclosed herein may be utilized in nonvolatile memory devices having a NAND or AND structure. In addition, logic gates may be replaced with equivalent circuit devices or with other logic devices.

What is claimed is:

1. A nonvolatile semiconductor memory device comprising:
   a sector on a substrate, the sector including memory cell transistors arranged in a cell array block and decoder transistors in a column decoder block;
   wherein the transistors in the cell array block and column decoder block share a common bulk region, wherein the common bulk region is formed on the substrate and is connected to a bulk driver, the bulk driver configured to commonly apply a bulk voltage to the common bulk region of the sector; and
   wherein said semiconductor memory device is configured to electrically erase all the memory cell transistors in the sector together.

2. A nonvolatile semiconductor memory device according to claim 1, wherein the semiconductor memory device is a NOR-type memory device.

3. A nonvolatile semiconductor memory device according to claim 1, further comprising a write driver and a sense amplifier.

4. A nonvolatile semiconductor memory device according to claim 3, wherein the write driver and sense amplifier are configured to be placed in a state of high impedance during an erase operation to avoid influencing circuit operation during the erase operation.

5. The device of claim 1, wherein the cell array block and the column decoder block share a plurality of word lines and a plurality of bit lines.

6. A sector structure of a nonvolatile semiconductor memory, said sector structure comprising:
   a plurality of memory cell transistors arranged in a cell array block; and
   a plurality of decoder transistors arranged in a column decoder block, wherein said memory cell transistors and decoder transistors are arranged on a common bulk region.

7. A sector structure of a nonvolatile semiconductor memory according to claim 6, wherein an erase operation is configured to erase all of the transistors in the sector simultaneously.

8. A sector structure of a nonvolatile semiconductor memory according to claim 6, said sector structure further comprising:
   a plurality of word lines arranged in the cell array block, each word line being connected to a plurality of cell gates;
   a plurality of bit lines arranged in the cell array block, each bit line being connected to a plurality of memory cell drains;
   a plurality of common data lines connected to the bit lines;
   a plurality of write drivers, each connected to a respective one of the common data lines; and
   a plurality of sense amplifiers, each connected to a respective one of the common data lines.

9. A sector structure of a nonvolatile semiconductor memory according to claim 8, wherein each write driver and sense amplifier is configured to be placed in a state of high impedance during an erase operation.

10. A sector structure of a nonvolatile semiconductor memory according to claim 6, wherein said sector structure is configured to provide 64 Kbytes of memory.

11. A sector of a nonvolatile semiconductor memory device comprising:
    a cell array block including a plurality of word lines, a plurality of bit lines, and a plurality of memory cell transistors having gates and drains, each gate being connected to a corresponding word line out of the plurality of word lines, each drain being connected to a corresponding bit line out of the plurality of bit lines;
    a source line driver commonly connected to a source of each of the plurality of memory cell transistors and configured to apply a source voltage;
    a column decoder block comprising a plurality of column decoder transistors, each column decoder transistor connected to a corresponding bit line out of the plurality of bit lines and a common data line configured to select one bit line out of the plurality of bit lines; and
    a common bulk region arranged in the sector and formed immediately adjacent to a substrate region, wherein the plurality of memory cell transistors and the plurality of column decoder transistors in the sector share the common bulk region; and
    a bulk driver, the bulk driver configured to commonly apply a bulk voltage to the common bulk region of the sector.

12. The sector of claim 11, wherein the nonvolatile semiconductor memory device is a NOR-type flash EEPROM.

13. The sector of claim 11, wherein the bulk region is a pocket P-well.

14. The sector of claim 11, further comprising a write driver and a sense amplifier, the common data line connected to the write driver and the sense amplifier.

15. The sector of claim 14, the write driver and the sense amplifier configured to be placed in a state of high impedance during an erase operation.

16. A nonvolatile semiconductor memory device comprising:
    a substrate;
    a sector unit, the sector unit including a common bulk region, the bulk region being formed on the substrate and connected to a bulk driver, the sector unit configured to be electrically erasable in response to an erase signal; and a plurality of memory cell transistors and transistors of a column decoder arranged in the common bulk region of the sector unit and configured to commonly receive a bulk voltage.

17. A nonvolatile semiconductor memory device according to claim 16, wherein the sector unit further comprises a bulk driver configured to supply a bulk voltage to the common bulk region.

18. A nonvolatile semiconductor memory device according to claim 16, wherein said plurality of memory cell transistors are arranged in a cell array block, wherein said plurality of column decoder transistors are arranged in a column decoder block, and wherein said cell array block and said column decoder block are both arranged on the common bulk region.

19. The device of claim 18, wherein the plurality of memory cell transistors of the cell array block are arranged in a (M×N) array and the plurality of column decoder transistors of the column decoder block are arranged within a (N×N) array adjacent to the cell array block, where M and N are at least equal to two.

20. A method of fanning a bulk region of a nonvolatile semiconductor device, said method comprising:

forming a bulk region for memory cell transistors provided in a cell array block of the nonvolatile semiconductor memory device, wherein the memory cell transistors of the cell array block are arranged in an (M×N) array with M and N both at least equal to two; and forming a bulk region for decoder transistors of a column decoder in the bulk region for the memory cell transistors of the cell array block, wherein the column decoder transistors of the column decoder are arranged within a (N×N) array adjacent to the cell array block.

21. A method of forming a bulk region of a nonvolatile semiconductor device, according to claim 20, further comprising configuring the bulk regions for the memory cell transistors and decoder transistors to receive a common bulk signal during an erase operation.

22. A method of forming a bulk region of a nonvolatile semiconductor device, according to claim 20, wherein said memory cell transistors and said decoder transistors are configured to be simultaneously erased with each other during an erase operation.

* * * * *

UNITED STATES PATENT AND TRADEMARK OFFICE
CERTIFICATE OF CORRECTION

PATENT NO. : 6,831,860 B2
DATED : December 14, 2004
INVENTOR(S) : Lee et al.

It is certified that error appears in the above-identified patent and that said Letters Patent is hereby corrected as shown below:

Column 9,
Line 5, replace "of fanning a bulk" with -- of forming a bulk --.

Signed and Sealed this

Thirty-first Day of January, 2006

JON W. DUDAS
*Director of the United States Patent and Trademark Office*